United States Patent [19]
Roeder et al.

[11] Patent Number: 6,030,454
[45] Date of Patent: Feb. 29, 2000

[54] COMPOSITION AND METHOD FOR FORMING THIN FILM FERRITE LAYERS ON A SUBSTRATE

[75] Inventors: Jeffrey F. Roeder, Brookfield; Thomas H. Baum, New Fairfield, both of Conn.

[73] Assignee: Advanced Technology Materials, Inc., Danbury, Conn.

[21] Appl. No.: 08/828,404

[22] Filed: Mar. 28, 1997

[51] Int. Cl.$^7$ .................................................. C30B 25/02
[52] U.S. Cl. ........................ 117/104; 117/99; 117/102; 117/103; 117/946; 117/947
[58] Field of Search ................. 117/99, 102, 103, 117/104, 946, 947

[56] References Cited

U.S. PATENT DOCUMENTS

| | | | |
|---|---|---|---|
| 5,108,983 | 4/1992 | Lackey et al. | 505/1 |
| 5,278,138 | 1/1994 | Ott et al. | 505/1 |

FOREIGN PATENT DOCUMENTS

| | | | |
|---|---|---|---|
| 5-198456 | 8/1993 | Japan . | |
| 8335514 | 12/1996 | Japan | H01F 10/20 |

OTHER PUBLICATIONS

Sukari et al., "Preparation of Ni–Zn Ferrite Thin Films by ICP Flash Evaporation Method", Journal of Ceramic Society of Japan, vol. 101 abs only pp. 1423–1426, Dec. 1993.

Metalorganic Chemical Vapor Deposition of Thick NiFe$_2$O$_4$ Ferrite Films, Y.Q. Li, et al., Abstracts, 1995 Fall Meeting, Materials Research Society, Nov. 27–Dec. 1, 1995, Boston, Massachusetts.

*Primary Examiner*—Robert Kunemund
*Attorney, Agent, or Firm*—Steven J. Hultquist; Oliver A.M. Zitzmann

[57] ABSTRACT

A method of forming a thin film ferrite material on a substrate from corresponding precursor(s), comprising liquid delivery and flash vaporization thereof to yield a precursor vapor, and transporting the precursor vapor to a chemical vapor deposition reactor for formation of the thin film ferrite material on the substrate. The invention also contemplates a device comprising a ferrite layer on a substrate, in which the ferrite layer is formed on the substrate by a process as described above.

19 Claims, 9 Drawing Sheets

COMPOSITION AND METHOD FOR FORMING THIN FILM FERRITE LAYERS ON A SUBSTRATE

GOVERNMENT RIGHTS IN INVENTION

This invention was made with Government support under Contract N00014-95-C-0261 awarded by the United States Department of Defense. The Government has certain rights in this invention.

BACKGROUND OF THE INVENTION

1. Field of the Invention

This invention relates generally to a method and compositions for forming thin film ferrite layers on substrates. More particularly, the invention relates to a method and compositions for forming thin film ferrite layers with metalorganic chemical vapor deposition (MOCVD) using a liquid delivery technique for flash vaporization of the precursor chemistry.

2. Description of the Related Art

High quality ferrite films possess numerous properties of technological importance, including high saturation magnetization, and magneto-optic effects. Two important ferrite families are the spinels, e.g., Ni—Zn ferrite, $(Ni,Zn)Fe_2O_4$, and Ni—Mn ferrite, $(Ni,Mn)Fe_2O_4$ and the hexagonal ferrites, e.g. $BaFe_9O_{11}$. The nickel-zinc and nickel-manganese materials are solid solutions in which the proportions of each metal can range very widely. The general formula for spinel type ferrite materials is $MFe_2O_4$ where M=Mn, Fe, Ni, Co, Cu, Mg, and Zn. The ferrites can also be mixed to optimize their properties. Typical examples are the addition of $ZnFe_2O_4$ to $NiFe_2O_4$, the addition of $ZnFe_2O_4$ to $MnFe_2O_4$, and the addition of $ZnFe_2O_4$ to $CoFe_2O_4$. $(Ni,Zn)Fe_2O_4$ is useful for high frequency applications, and $(Mn,Zn)Fe_2O_4$ is useful as a soft magnetic material.

Other ferrites include the hexaferrites, so called because of their hexagonal crystal structure. These ferrite materials include $BaFe_{12}O_{19}$ and $SrFe_{12}O_{19}$.

In each of the ferrite systems, precise and repeatable compositional control is required in order to produce films of high quality. Physical deposition methods (e.g., sputtering, evaporation) to fabricate thin film deposition are deficient in this regard, as are traditional approaches to metalorganic chemical vapor deposition (MOCVD) involving the use of bubblers.

A great need exists to miniaturize discrete magnetic components. At present, discrete filters, limiters, phase shifters, isolators and circulators are large and costly when compared to the active circuits with which they are associated. Thin film-based devices are an attractive solution to this problem, but require cost-effective processing of films in the thickness range of from about 3 to about 30 microns, as well as low process temperatures (approximately 450° C.) to carry out direct integration (for devices other than hybrid devices, where process temperature may not be a major issue).

A number of processes have been investigated to date for depositing ferrite films, including pulsed laser ablation deposition (PLD), sputter deposition, and spin spray processing (SSP). While high quality films have been produced in some cases, no technique has yet been demonstrated which has clear potential for the manufacture of commercially viable devices.

The high rate deposition techniques which have been used successfully for multicomponent oxide thin films are pulsed laser ablation deposition (PLD) and chemical vapor deposition (CVD). The use of PLD for ferrite films (Mn,Zn ferrite) has been investigated and the quality of films produced was acceptable. However, as the deposition area is scaled in PLD, one loses the deposition rate advantage that is inherent to PLD. Area scaling is important in making ferrite layers because, although device and chip dimensions are small, cost-effective deposition in an integrated process is ideally accomplished at wafer scale dimensions.

Sputter deposition has also been investigated for ferrite films for many years. However, sputter deposition has the drawback of low rates for oxide deposition, relatively low oxygen partial pressures during processing, and stoichiometry control issues related to preferential sputtering.

An innovative technique, termed spin spray processing (SSP), has been investigated by various researchers. This technique has the advantage of processing at 100° C., but unfortunately the resultant film properties have not been as good as desired and film losses have been high in the practice of such technique.

It would therefore be a significant advance in the art, and is accordingly an object of the present invention, to provide a method for the formation of thin film ferrite materials by MOCVD which affords a close stoichiometric control of the product ferrite film, and which is able to be usefully carried out at low temperature process conditions.

Other objects and advantages of the invention will be more fully apparent from the ensuing disclosure a nd appended claims.

SUMMARY OF THE INVENTION

The present invention contemplates a method of depositing thin film ferrite materials by metalorganic chemical vapor deposition (MOCVD) utilizing a liquid delivery technique.

Relative to previous ferrite deposition techniques, the process of the present invention affords precise compositional control by use of liquid precursor solutions which are flash vaporized. Flash vaporization has the added benefit of preventing unwanted premature decomposition of the precursor species; this is especially important for Group II metals (e.g., Ba).

In addition, the invention utilizes tailored precursor chemistries that are compatible for forming the thin film material, and such precursor chemistries do not undergo ligand exchange (or alternatively have degenerate exchange). The formation of involatile species is thereby avoided in the practice of the invention.

In contrast to other approaches, metalorganic chemical vapor deposition (MOCVD) offers a unique combination of attributes not found in other processes: high deposition rates, good composition control, scalability to large areas, and conformality.

The present invention in one aspect relates to a method of forming a thin film ferrite material on a substrate from corresponding precursor(s), comprising liquid delivery and flash vaporization thereof to yield a precursor vapor, and transporting the precursor vapor to a chemical vapor deposition reactor for chemical vapor deposition formation of the thin film ferrite material on the substrate.

The precursor(s) in the above-described method may suitably comprise organometallic compounds or coordinated complexes of metal(s) selected from the group consisting of nickel, zinc, iron, manganese, and cobalt, or, more generally, metal β-diketonate compounds or coordinated complexes.

Such compounds or complexes may be fluorinated β-diketonate compounds or coordinated complexes. Alternatively, such compounds or complexes may be non-fluorinated in character, and may include metal β-diketonate Lewis base adducts.

The ferrite material may be Ni—Zn ferrite, Ni—Mn ferrite, Ba hexaferrite, or other useful ferrite material.

In a particular aspect, the precursor(s) is/are dissolved in a solvent and flash vaporized at a temperature of between 100° C. and 300° C. The precursor vapor is transported to the chemical vapor deposition reactor in a carrier gas, such as argon, nitrogen, neon, helium or ammonia. The carrier gas may be mixed with an oxidizing co-reactant gas prior to its transport to the chemical vapor deposition reactor.

Although any suitable process conditions may be employed, the chemical vapor deposition reactor may contain substrate articles which preferably are heated for the chemical vapor deposition step, to a temperature in the range of from about 300° C. to about 1200° C. The pressure of the precursor vapor in the chemical vapor deposition reactor may be from about 0.1 to about 760 torr.

Lower substrate temperatures are preferred for device integration, where layers may need to be grown on other, already-formed substructures which must be preserved intact. On the other hand, higher crystalline quality is generally obtained at higher substrate temperatures. The temperature range of 550° C.–700° C. is a preferred range as it balances these considerations. The process of the invention may optionally further include a rapid thermal anneal at temperatures as high as 1200° C.

The precursor metal may be complexed by a B-diketonate ("bkd") ligand, particularly useful examples of which include 2,2,6,6-tetramethyl-3,5-heptanedionate (abbreviated thd) and hexafluoroacetylacetonate (abbreviated hfac). Exemplary complexes include $Fe(thd)_3$, $Zn(thd)_2$ and $Ni(thd)_2$. Additionally, the volatility and transport properties of the metal-β-diketonate complex may be improved by coordination with a Lewis base ("L"), for example a polyamine, e.g., tetramethylethylenediamine (tmeda), pentamethyldiethylenetriamine (pmdeta), diethylenetriamine (deta), tetraethylenepentaamine (tepa), or hexamethyltetraethylenepentaamine (hmtepa), or a polyether such as tetraglyme (teg) or diglyme. Exemplary Lewis base adduct complexes include $Ni(thd)_2(teg)$, $Ni(thd)_2(tmeda)$, $Ni(hfac)_2(tmeda)$, $Fe(hfac)_3(tmeda)$ and $Zn(hfac)_2(tmeda)$.

The invention in another aspect relates to a device comprising a ferrite layer on a substrate, wherein the ferrite layer is formed on the substrate by a process including: providing corresponding precursor(s) for the ferrite layer, transporting the precursor(s) by liquid delivery and flash vaporization thereof to yield a precursor vapor, and transporting the precursor vapor to a chemical vapor deposition reactor for chemical vapor deposition formation of the thin film ferrite material on the substrate.

The invention in another aspect relates to a thin film ferrite material, e.g., as formed on a substrate, wherein the material is formed from precursor(s) selected from the group consisting of (i), (ii) and (iii):

(i) $Fe(bdk)_3$, $Zn(bdk)_2$ and $Ni(bdk)_2$;
(ii) $Fe(bdk)_3$, $Mn(bdk)_2$ and $Ni(bdk)_2$; and
(iii) $Ba(bdk)_2$ and $Fe(bdk)_3$.

The invention relates in another compositional aspect to a thin film ferrite material on a substrate, wherein the material is formed from precursor(s) selected from the group consisting of (i), (ii) and (iii), where each precursor is coordinated with a Lewis base L:

(i) $Fe(bdk)_3L$, $Zn(bdk)_2L$ and $Ni(bdk)_2L$;
(ii) $Fe(bdk)_3L$, $Mn(bdk)_2L$ and $Ni(bdk)_2L$; and
(iii) $Ba(bdk)_2L$ and $Fe(bdk)_3L$.

Other objects and advantages of the invention will be more fully apparent from the ensuing disclosure.

DETAILED DESCRIPTION OF THE INVENTION AND PREFERRED EMBODIMENTS THEREOF

Figure 1:
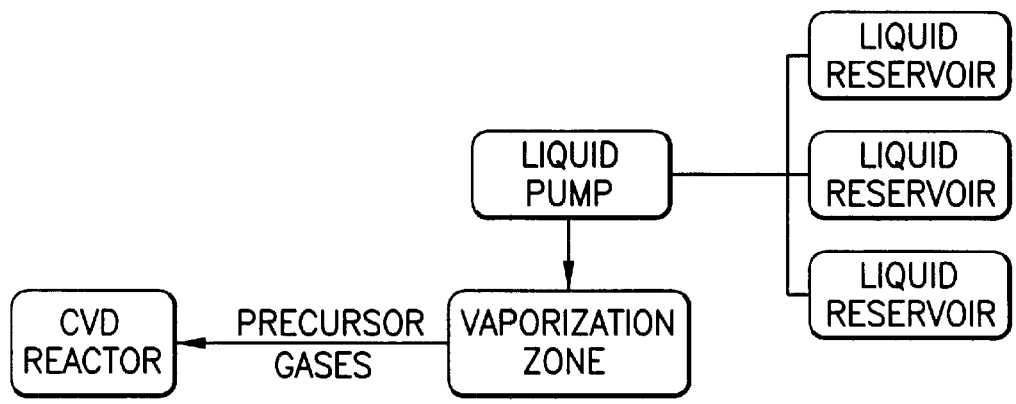
FIG. 1 illustrates a schematic view of a liquid delivery system for simultaneous, controlled introduction of metalorganic compounds to a CVD reactor, representing an embodiment of the present invention.

Referring to FIG. 1, a low pressure CVD system can be modified for the deposition of ferrite films using liquid delivery of metalorganic precursors. Any suitable apparatus can be used for such purpose, e.g., a Sparta® 450 liquid delivery system (commercially available from Advanced Technologies Materials Inc., Danbury, Conn. (ATMI)), integrated with an existing MOCVD system. Such a modified apparatus enables a liquid delivery technique for simultaneous, controlled introduction of metalorganic compounds to the CVD reactor.

Figure 2:
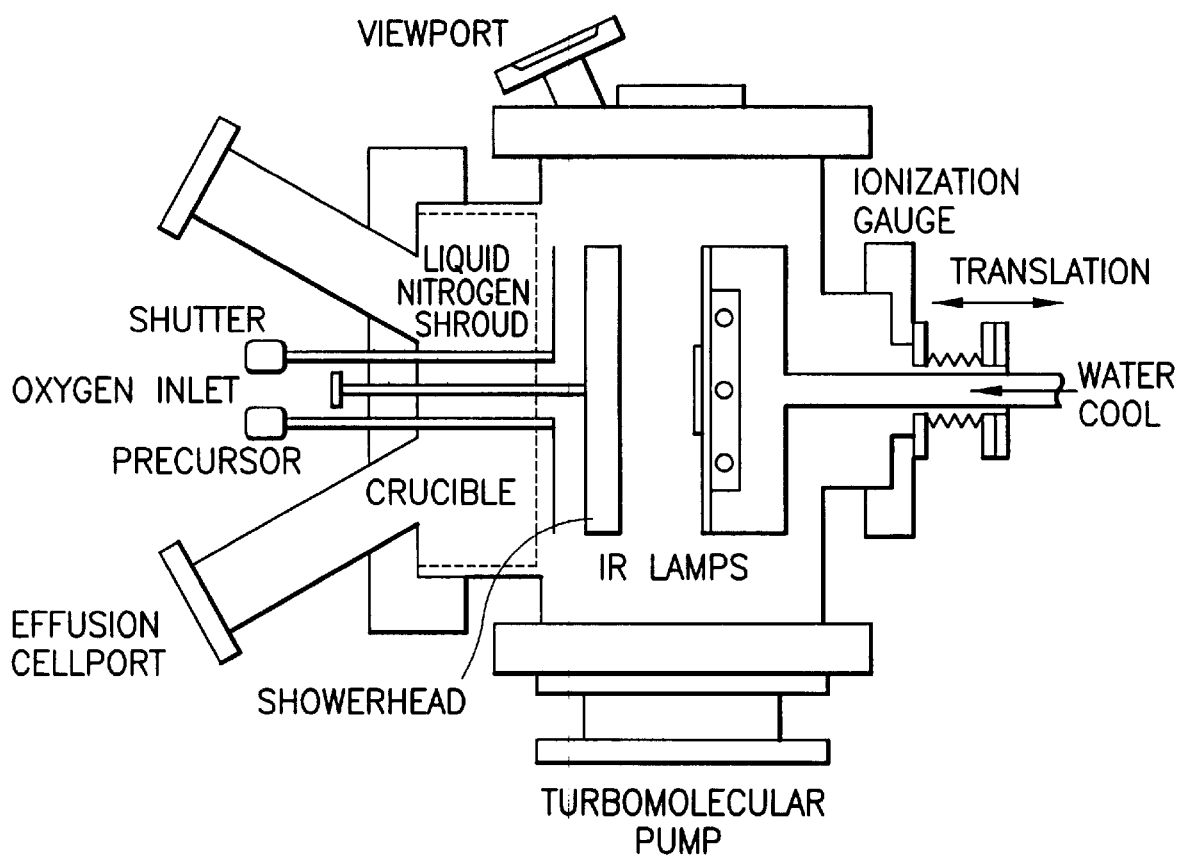
FIG. 2 illustrates a schematic view of a MOCVD reactor system, representing an embodiment of the present invention.

Referring now to FIG. 2, an MOCVD reactor system includes a showerhead to distribute the process gases uniformly across the wafer heater assembly. The CVD chamber is an ultrahigh vacuum (UHV) compatible, nominally cold-wall stainless steel reactor with bake-out capabilities, and equipped with a load-lock for wafer transfer. The showerhead allows uniform distribution of precursor gases over the surface of the substrate.

The deposition chamber is based upon a stainless steel 6-way cross. The system is pumped with both mechanical (15 scfm) and turbomolecular (300 l/s) pumps, which give a base pressure $<1\times10^{-7}$ torr. The load lock is similarly pumped by a turbomolecular pump. Sample transfer is via a twenty-two inch linear-rotary magnetic feed through. For simplicity, the loadlock assembly is not shown. Pressure is monitored via conduction-convection ($\geq 10^{-3}$ torr) and ionization gauges ($10^{-3}$ to $10^{-9}$ torr).

Use of alternative MOCVD deposition chambers is also possible, e.g., a tube geometry with or without a showerhead for reagent dispersal into the chamber.

The substrate heater assembly has a working hot zone >2 inch diameter. The heaters are quartz lamps mounted above a water-cooled polished reflector. The heater assembly can translate towards the source flange.

For the ferrite depositions, organometallic precursors with appropriate vapor pressures to allow the use of a standard bubbler assembly do not exist. The liquid delivery approach of the present invention therefore remedies the deficiencies of the prior art, and achieve a substantial advance in the art.

The use of low vapor pressure metalorganic sources may be accommodated in the practice of the present invention by the use of a heated showerhead assembly, to ensure laminar flow of gases to the substrate in instances where gas volumes have increased substantially. The showerhead assembly provides a gas distribution system over the wafer. The showerhead may be of any suitable type, and may for example consist essentially of a flattened cylindrical can with an array of holes in the flat surface facing the substrate. It may be located in front of the substrate as shown in FIG. 2. Uniform deposition requires that the showerhead diameter be greater than the substrate diameter.

In operational runs demonstrating the utility of the invention, the showerhead temperature was set by fixing the radiative heating from the substrate assembly by adjusting the substrate-showerhead distance. This temperature is important because it must be between the precursor vaporization and decomposition temperatures. Temperatures of 180° C. were sufficient to prevent condensation of Ni(thd)$_2$, the transport of which was limiting the specific applications in which Ni(thd)$_2$ was utilized as a ferrite precursor species.

The substrate assembly in these specific runs was calibrated over the temperature range 400° C. to 850° C. using a pyrometer. The calibration included two sample holder assemblies. The liquid delivery and flash vaporization system included plumbing, process gas regulators, mass-flow controllers and filters, the vaporizer and liquid delivery system, and the exhaust lines. The precursor assemblies in such system were provided as stainless steel vessels with level sensors.

In a preferred embodiment, the precursors were dissolved in a solvent and flash vaporized at temperatures between approximately 100° C. and approximately 300° C. and carried into the metalorganic chemical vapor deposition (MOCVD) reactor with a carrier gas (e.g., Ar, N$_2$, He, or NH$_3$). The precursors were then mixed with an oxidizing co-reactant gas (e.g., O$_2$, N$_2$O, O$_3$) and underwent decomposition at a substrate heated to between approximately 300° C. and approximately 1200° C., at chamber pressures between approximately 0.1 torr and approximately 760 torr. Other active oxidizing species may be used in the broad practice of the present invention to reduce deposition temperature, as for example through the use of a remote plasma source.

Compatible precursor chemistries are described below for Ni—Zn ferrite; Ni—Mn Ferrite; and Ba hexaferrite.

Metalorganic precursors for MOCVD of Ni—Zn ferrite comprise safe, low vapor pressure metalorganic sources, including non-fluorinated or fluorinated β-diketonates, optionally with Lewis base adducts. Vaporization conditions may readily be determined for the precursor compounds/complexes to yield efficient gas phase transport. As a specific example of the inveniton, an MOCVD chamber was modified for liquid delivery and a process was conducted in accordance with the invention which yielded epitaxial NiFe$_2$O$_4$ films on MgO substrates at relatively low temperatures (650° C), with very high crystalline quality as demonstrated by x-ray rocking curves and low roughness. Mass-transport limited growth was demonstrated with rates up to 1.2 μm/hr. Growth rate could be increased beyond the levels demonstrated, by increasing the rate of precursor flow. In this system, fluorinated β-diketonates can offer even higher growth rates, since thermal gravimetric analysis (TGA) and differential scanning calorimetry (DSC) show their rate of transport to be high. Magnetic characterization of as-deposited films yielded saturation magnetization of approximately ⅓ bulk values. Electrical resistivity of the films was greater than $10^6$ ohm-cm.

Three approaches were taken to developing precursors for MOCVD of ferrites. In all cases, safe, relatively low volatility sources were developed. First, baseline chemistry was developed using non-fluorinated β-diketonate ligands. The second approach modified these compounds using Lewis base adducts. A third approach examined fluorinated β-diketonate ligands.

Iron(III) tris(2,2,6,6-tetramethyl-3,5-heptanedionate), Fe(thd)$_3$, and zinc(II) bis(2,2,6,6-tetramethyl-3,5-heptanedionate), Zn(thd)$_2$, were used as starting materials. The Zn and Fe complexes were examined by nuclear magnetic resonance (NMR) to determine the chemical shifts of the ligand protons and purity of the complexes. Both complexes displayed good purity (NMR and TGA data) and solubility in the organic solvents. The NMR for Fe was obtained, but displayed broad resonances as a result of the paramagnetic nature of the iron (III) complex; in essence the NMR confirmed the oxidation state of the iron complex as being +3. The Zn(thd)$_2$ displayed singlets at 1.095 and 5.84 ppm in perdeuterobenzene. Thus, these complexes of Fe and Zn were high purity and displayed useful solubilities for liquid delivery MOCVD of ferrite films. Nickel (II) bis(2, 2,6,6-tetramethyl-3,5-heptanedionate), Ni(thd)$_2$, was synthesized from Ni(NO$_3$)$_2$ and Na(thd) (generated in-situ from Hthd and NaOH) in a mixture of water and isopropanol. A pale green solid precipitated over time with stirring and was isolated by vacuum filtration in a Buchner funnel. This solid contained copious amounts of water (it was presumed to be Ni(thd)$_2$ 2H$_2$O) and was dehydrated by pumping under vacuum (100 mT) for 12 hours at 105° C. The excess Hthd and water were removed leaving a bright purple solid. Nuclear magnetic resonance (NMR) displayed singlets at 1.20 and 5.52 ppm in deuterobenzene. The chemical shifts and melting point (229° C.) were consistent with reported literature values for Ni(thd)$_2$.

A second synthetic procedure for Ni(thd)$_2$ was examined using anhydrous NiCl$_2$ and Hthd in the presence of t-butylamine; the amine behaved as a base leading to the formation of ammonium chloride salts. In this manner, inclusion of water was avoided, thereby producing an anhydrous complex directly. Tetraglyme or other Lewis bases could be added during the synthesis to produce the teraglyme (Lewis base) adduct of Ni(thd)$_2$ directly. Bright aqua blue crystals were isolated after filtration and upon concentration of the mother liquor. The blue crystals appeared cubic in orientation and were obtained in high yield. An NMR spectrum could not be obtained because of the high spin state of Ni (II) adducts.

Figure 3A:
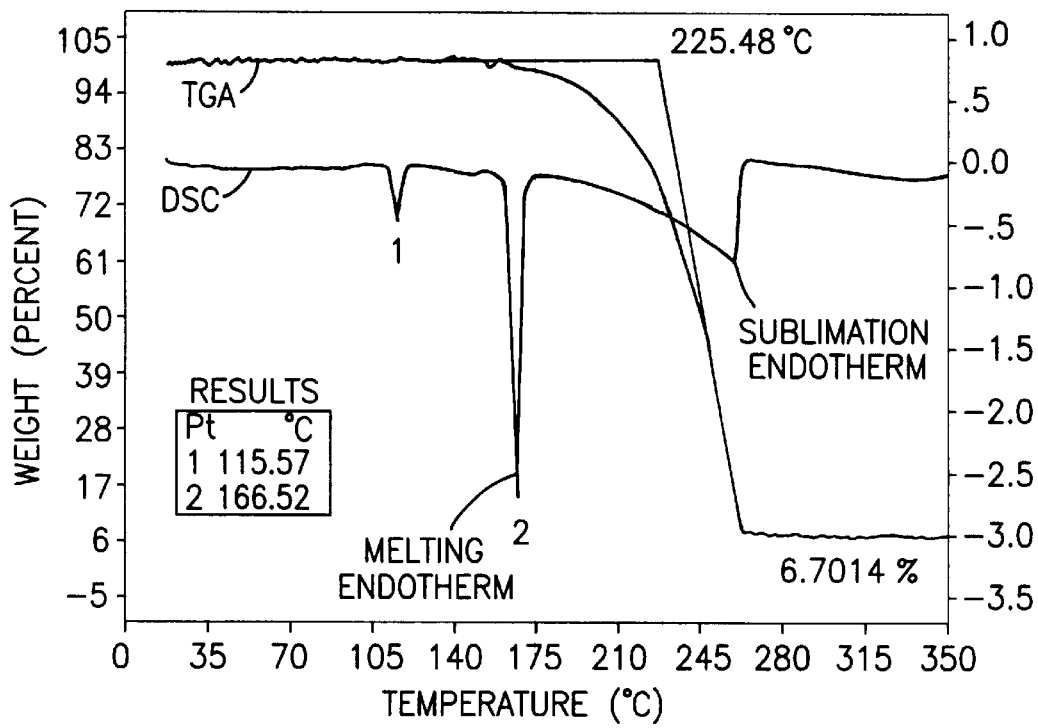
FIGS. 3A and 3B illustrate thermal gravimetric analysis (TGA) and differential scanning calorimetry (DSC) data measured from samples of $Fe(thd)_3$ and $Zn(thd)_2$ in argon, respectively, representing embodiments of the present invention.
Figure 3B:
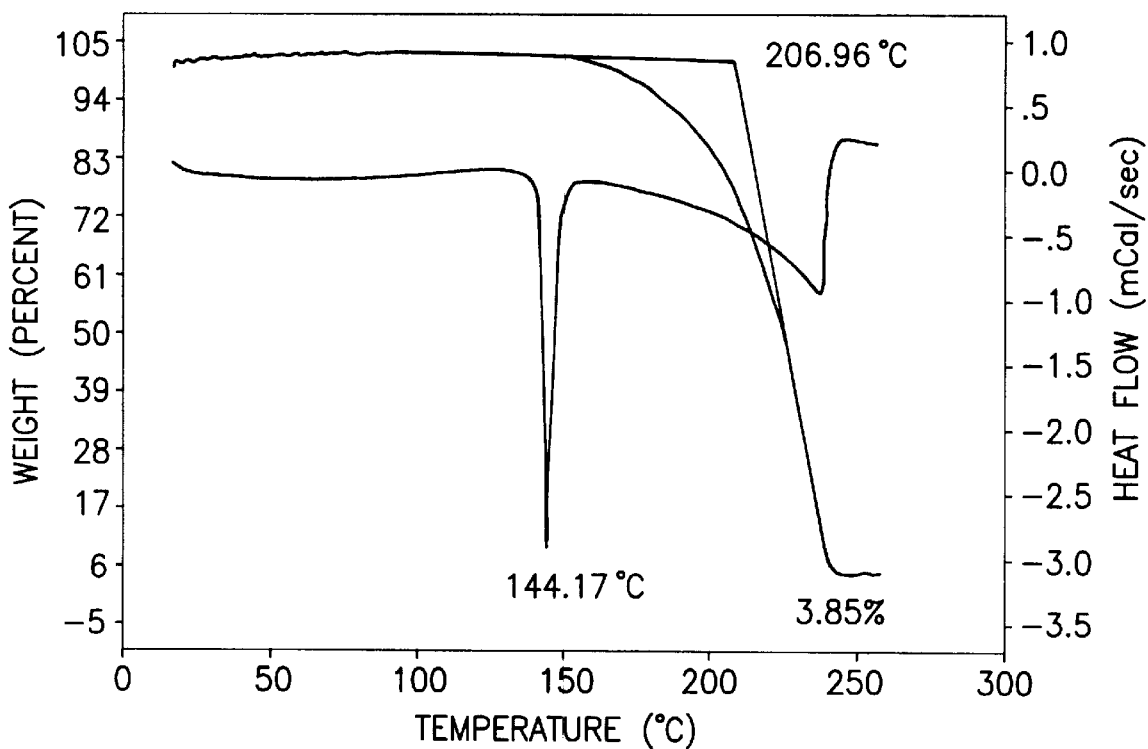

The thermal analysis of source compounds is depicted in FIGS. 3A–3B. Referring to FIGS. 3A–3B, thermal gravimetric analysis (TGA) and differential scanning calorimetry (DSC) data measured from a sample of Fe(thd)$_3$ (left) and Zn(thd)$_2$ (right) in argon are depicted.

The gas-phase transport and thermal stability of the (thd) complexes were examined by simultaneous thermal gravimetric analysis (TGA) and differential scanning calorimetry (DSC) on a Rheometrics STA-1000. The TGA provides weight loss data as a function of temperature and the DSC provides calorimetric data for crystalline changes, melting transitions, sublimation, evaporation and eventually, thermal decomposition. Small weighed samples of Fe(thd)$_3$ and Zn(thd)$_2$ were analyzed, as well as several Ni complexes. The iron and zinc thermograms are shown in FIGS. 3A and 3B, respectively. These compounds displayed melting endotherms located at 166° C. and 144° C., respectively (marked on the DSC curves), prior to nearly complete vaporization (4–7% residues).

Figure 4:
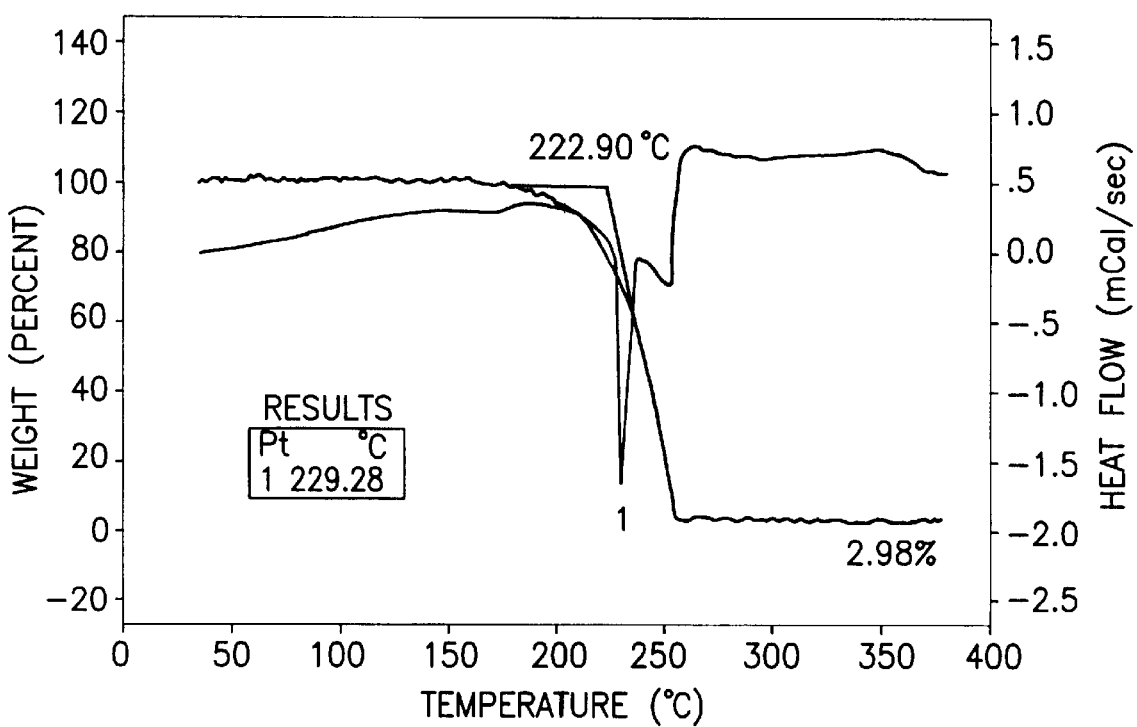
FIG. 4 illustrates TGA and DSC data measured from a sample of anhydrous $Ni(thd)_2$ synthesized via an aqueous method using nickel nitrate, representing an embodiment of the present invention.

The synthesized anhydrous Ni(thd)$_2$ complex was examined and displayed a melting endotherm at 229° C. with nearly complete vaporization below 260° C. (3% residue), as shown in FIG. 4. Referring to FIG. 4, thermal gravimetric analyses (TGA) and differential scanning calorimetry (DSC) data for anhydrous Ni(thd)$_2$ synthesized via the aqueous method using nickel nitrate are depicted. The complex was dried under vacuum to remove the coordinated water molecules, as described above.

The DSC/TGA curves contain significant information concerning the transport behavior of metalorganic species. The TGA curve should generally be smooth and drop off in a single step as shown in FIGS. 3A–3B. Multiple steps indicate molecular rearrangement or decomposition of the material. The DSC curve shows phase transitions such as the melting and sublimation endotherms. Melting prior to vaporization is generally beneficial. Finally, the lower shelf of the TGA curve shows the amount of residue left over from the experiment. In general, amounts less than approximately 6–8% are sufficient for good vaporization.

Using β-diketonate (bdk), especially thd, ligands for the metal precursors is advantageous because these materials are readily transported for MOCVD of ferrites. Additionally, coordination with Lewis bases can also increase transport, especially for compounds of fluorinated β-diketonates such as hfac. In general, lower melting points and more efficient transport are desirable outcomes of structural modifications to the precursor.

Figure 5:
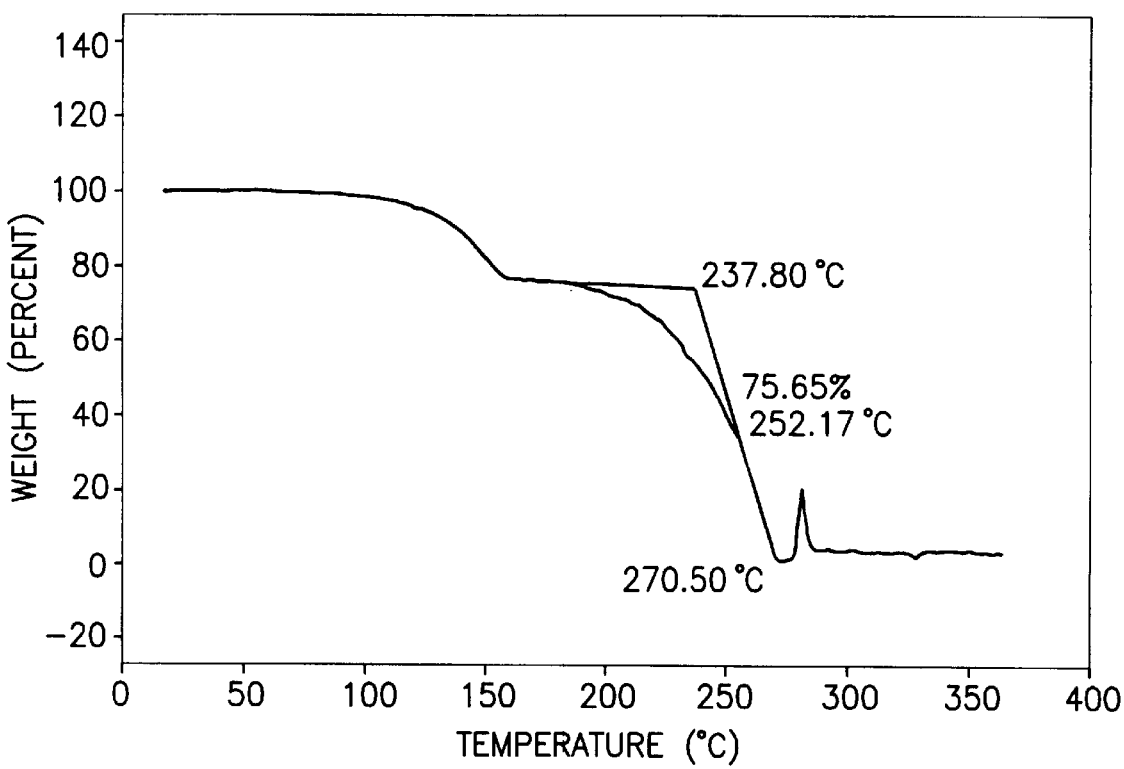
FIG. 5 illustrates TGA data measured from a sample of $Ni(thd)_2$ tetraglyme adduct in argon, representing an embodiment of the present invention.

The syntheses of several Lewis base (L) adducts of Ni(thd)$_2$, denoted (L)Ni(thd)$_2$, were explored. The Ni(thd)$_2$ synthesized previously was dissolved into ether and reacted with an equimolar amount of a Lewis base, namely tetraglyme (teg), N,N,N',N'-tetramethyletheylenediamine (tmeda) or N,N,N',N",N"-pentamethyldiethylenetriamine (pmdeta). After stirring for several hours, the solvent was removed under nitrogen and the desired material was isolated. The (teg)Ni(thd)$_2$ adduct was an aqua blue crystalline solid and was analyzed by TGA/DSC. Referring now to FIG. 5, thermal gravimetric analysis of Ni(thd)$_2$ tetraglyme in argon is depicted. The first weight loss is believed to be the liberation of the tetraglyme ligand from the molecule species. The tetraglyme was weakly associated with the Ni center and was liberated upon heating (25% weight loss below 160° C.). The calculated weight loss for a 1:1 tetraglyme: Ni species was 34% which may indicate that one tetraglyme ligand interacts directly with two Ni centers.

Figure 6:
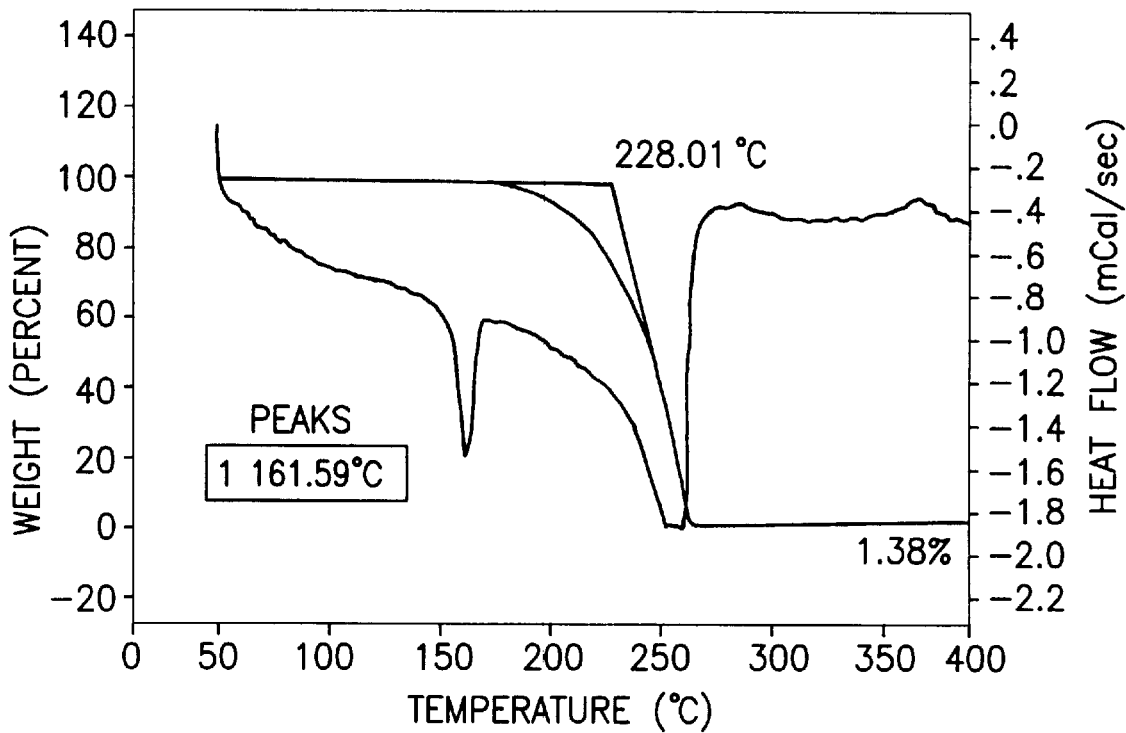
FIG. 6 illustrates TGA and DSC data measured from a sample of $Ni(thd)_2$ tmeda adduct, representing an embodiment of the present invention.

Other Lewis base adducts were also synthesized. The (peta)Ni(thd)$_2$ compound was a sticky green solid which became a pale green solid after washing with acetone to remove excess peta ligand. The (tmeda)Ni(thd)$_2$ was a free-flowing forest green solid. Neither solid could be analyzed by NMR, a result of their high-spin, paramagnetic states. However, the materials were analyzed by simultaneous thermal analysis (TGA and DSC) and compared to the parent "free" Ni(thd)$_2$. For (tmeda)Ni(thd)$_2$ (FIG. 6) the melting point dropped substantially relative to anhydrous Ni(thd)$_2$ (FIG. 4); melting was observed at 163° C. with nearly complete transport observed by 270° C. (1.4% residue) (FIG. 6). The volatility of the tmeda adduct was not increased relative to the parent species, but clean transport was observed based upon the remaining residue. For the (peta)Ni(thd)$_2$ the melting point was increased to 304° C. and decomposition occurred prior to or in concert with transport. In fact, a residue of 54% was found and consisted of a black solid material, possibly NiO by optical appearance. This result demonstrates the importance of molecular structure in relation to physical properties.

Referring now to FIG. 6, thermal gravimetric analysis (TGA) and differential scanning calorimetry (DSC) of Ni(thd)$_2$ tmeda adduct are depicted. This material exhibited a lower melting endotherm than the parent molecule and clean thermal transport; both of these attributes suit it well for liquid delivery CVD.

Using hydrated Ni(hfac)$_2$ a tmeda Lewis base adduct was synthesized. A bright, forest-green crystalline solid was isolated after removal of the solvent. Interestingly, thermal gravimetric analysis (weight loss versus temperature) of this complex (FIG. 7A) was very different when compared to the hydrated complex (see FIG. 7B). For (tmeda)Ni(hfac)$_2$ (FIG. 7A), clean vaporization was observed upon heating and sharply contrasted with the step-wise vaporization observed in analogous hydrated species (FIG. 7B). Also, partial decomposition was not observed during heating of (tmeda)Ni(hfac)$_2$ and clean transport of the material was evidenced by the small amount of remaining residue (1.0% residue). It is presumed that the Lewis base reduces the intermolecular interactions in the crystal lattice associated with the Ni center, adding to the thermal stability and enhancing transport of the material in the gas-phase. This result demonstrated the ability to control vaporization and transport on a molecular level, via chemical structural modifications to the precursor.

Figure 7A:
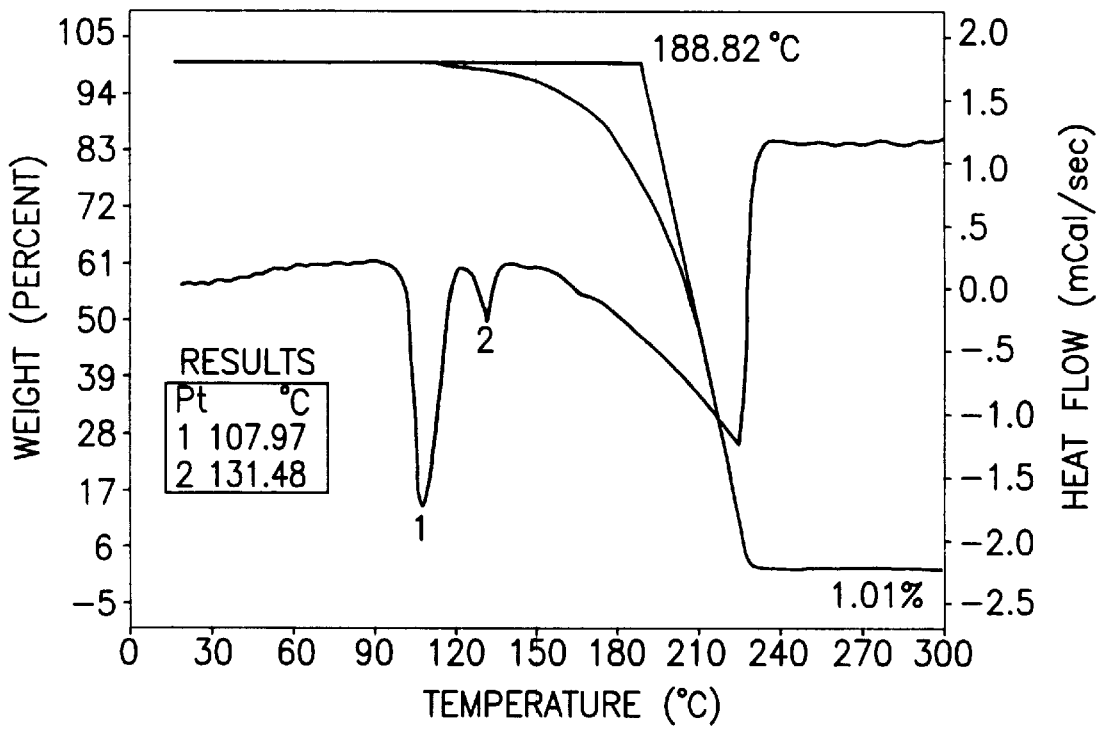
FIGS. 7A and 7B illustrate TGA and DSC data measured from samples of $(tmeda)Ni(hfac)_2$, representing a reagent useful in an embodiment of the present invention, and $(H_2O)_2Ni(hfac)_2$, shown for comparison, respectively.
Figure 7B:
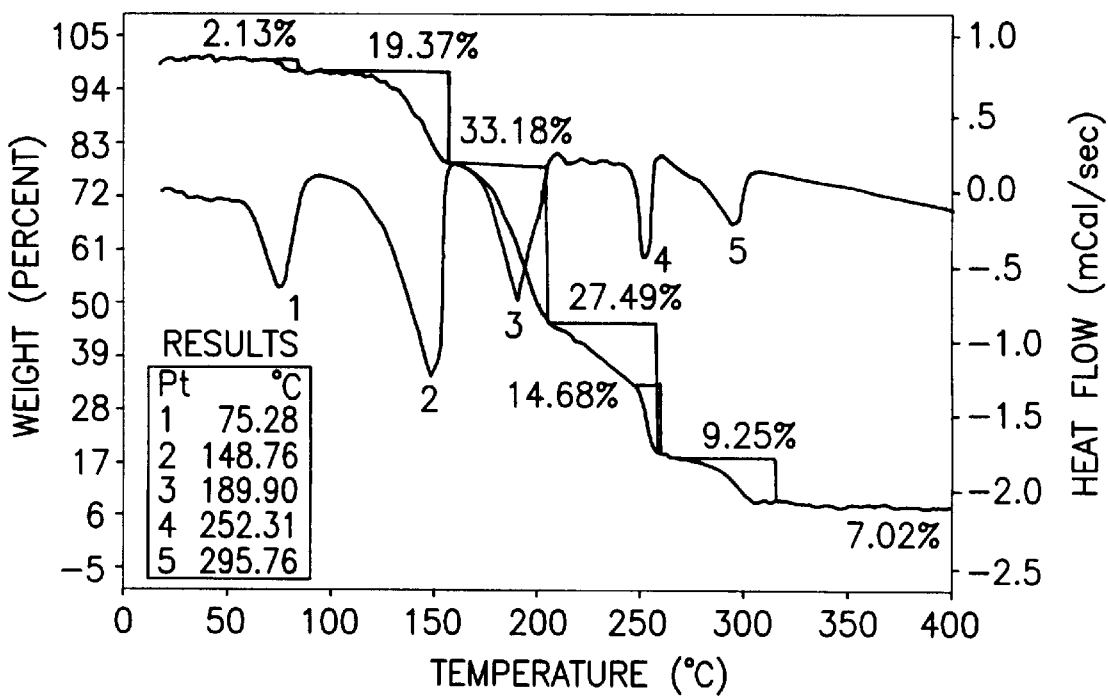

Referring now to FIGS. 7A and 7B, thermal gravimetric analysis (TGA) and differential scanning calorimetry (DSC) of $(tmeda)Ni(hafc)_2$ (a. left) and $(H_2O)_2Ni(hfac)_2$ (b. right) are depicted. The tmeda adduct displays a smooth weight loss below 240° C. indicative of clean thermal transport on heating. The hydrated complex is thermally degraded and appears to lose both water and hfac ligands sequentially.

Figure 8A:
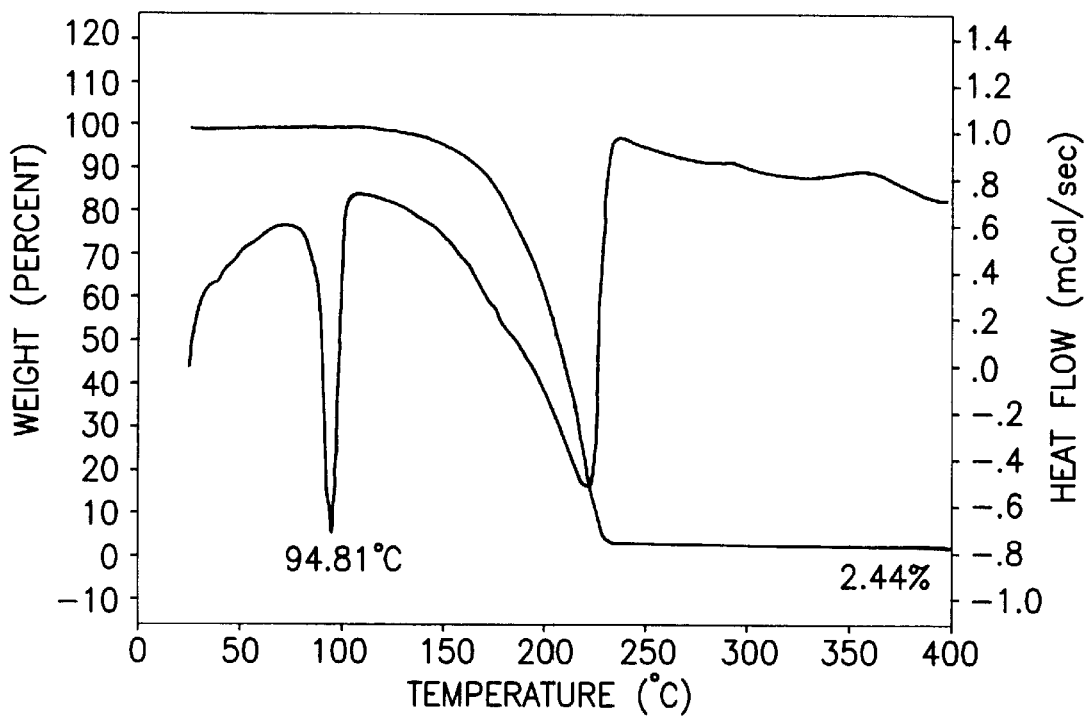
FIGS. 8A and 8B illustrate TGA and DSC data measured from samples of $(tmeda)Zn(hfac)_2$, representing a reagent useful in an embodiment of the present invention, and $(H_2O)_2Zn(hfac)_2$, shown for comparison, respectively, in argon.

Based on the results obtained for $(L)Ni(hfac)_2$, the synthesis of Lewis base (L) adducts of Zn (II) bis (1,1,1,5,5,5-hexafluoroacetylacetonate), $(L)Zn(hfac)_2$, were also explored. Hydrated $Zn(hfac)_2$ was dissolved into tetrahydrofuran with an equimolar amount of N,N,N',N'-tetramethylethylenediamine (tmeda). After stirring overnight, the solvent was removed under a nitrogen flow and the desired $(tmeda)Zn(hfac)_2$ material was isolated as a light brown solid. The material was analyzed by simultaneous thermal analysis (TGA and DSC) as shown in FIG. 8A and compared to the "hydrated" $Zn(hfac)_2$ shown in FIG. 8B. For $(tmeda)Zn(hfac)_2$ the melting point was observed at 95° C. and nearly complete (2.4% residue) vaporization was noted by 230° C. In contrast, the hydrated complex displayed several endotherms below 150° C. which are not clearly understood at present. The reported melting point in the literature for the hydrated complex is 157–158° C. Interestingly, this transition was not observed during our thermal analysis, due to extensive vaporization prior to 155° C. The earlier endotherms may be a result of crystalline phase changes in the solid material.

Figure 8B:
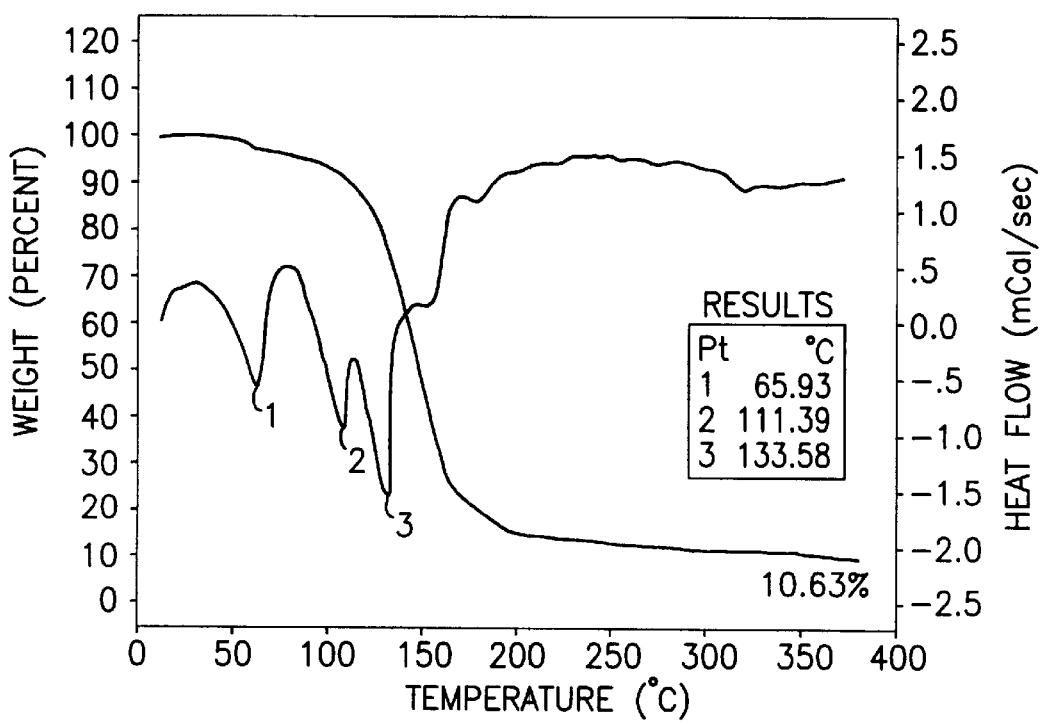

Referring now to FIGS. 8A–8B, thermal gravimetric analysis (TGA) and differential scanning calorimetry (DSC) of $(tmeda)Zn(hfac)_2$ (a. left) and $(H_2O)_2 Zn(hfac)_2$ (b. right) in argon is depicted. The hydrated complex leaves 10% residue after heating and the tmeda adduct leaves 10% residue after heating and the tmeda adduct leaves ≦2% residue after heating.

The DSC/TGA data for $(tmeda)Zn(hfac)_2$ suggest that this material provides efficient transport of the precursor during MOCVD. Although the temperature for complete vaporization has increased relative to the hydrate, the fluorinated Zn adduct demonstrates nearly complete vaporization and transport. Thus, the use of tmeda adducts for Ni and Zn offers a viable approach to Ni—Zn ferrite films using fluorinated β-diketonates as CVD precursors.

While not intending to be bound by theory, in view of the experimental data obtained and the observed solubilities in organic solvents, the thd complexes of Fe, Ni and Zn represent suitable candidates for liquid delivery CVD of the ferrite films. However, using Lewis base adducts of $Ni(hfac)_2$ and $Zn(hfac)_2$ in tandem with $Fe(hfac)_3$ provides potentially faster film growth rates and a unique chemical pathway to CVD ferrite films. The formation of metal fluorides in the film is an issue when using fluorinated precursors. The chemical approach of using metal β-diketonate chemical precursors for MOCVD of ferrite films is highly advantageous.

Specific embodiments of the present invention will now be further described by the following, nonlimiting examples which will serve to illustrate various features of significance. The examples are intended merely to facilitate an understanding of ways in which the present invention may be practiced and to further enable those of skill in the art to practice the present invention. Accordingly, the examples should not be construed as limiting the scope of the present invention.

EXAMPLE I

MOCVD and Phase Characterization

The baseline chemistry chosen for MOCVD was the non-fluorinated beta-diketonates: $Fe(thd)_3$ and $Ni(thd)_2$. The approach included deposition of the single Fe and Ni oxides first to determine the relative growth rates of these oxides. This information was used to calculate the incorporation efficiencies in order to determine the composition of the precursor solution for Ni-ferrite deposition. Deposition was performed simultaneously on two types of substrates: MgO single crystals and $Si/SiO_2$ wafers. MgO is a substrate which has been used by several groups for preliminary investigations into ferrite film deposition. It has a reasonably good lattice match with the cubic spinel structure of $(Ni,Zn)Fe_2O_4$ (the spinel lattice parameter is almost exactly twice that of MgO). The surface of the MgO was prepared for reproducible nucleation and microstructures by annealing in oxygen at 1100° C., as described in "Investigation of Optical Loss Mechanisms in Oxide Thin Films," A. F. Chow, 0. Auciello, D. B. Poker, and A. I. Kingon, *Integrated Ferroelectrics*, April, (1995).

Figure 9:
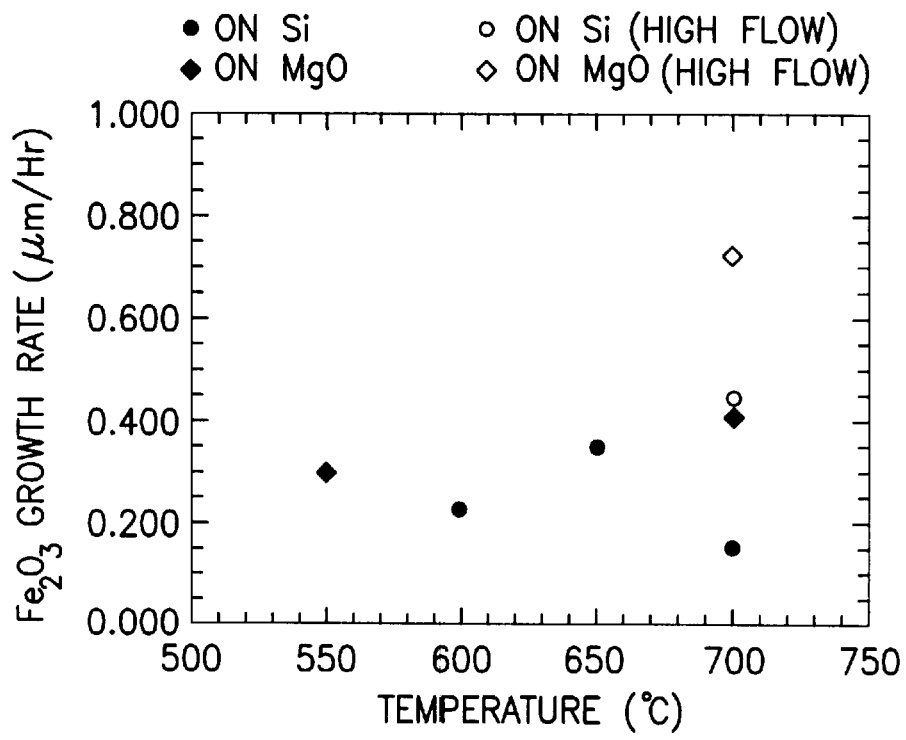
FIG. 9 illustrates growth rates for nominally $Fe_2O_3$ on Si and MgO, as a function of substrate temperature, representing embodiments of the present invention.

Substrate temperature was the primary process parameter which was investigated for deposition of the single oxide films. Sequence of depositions at various substrate temperatures were performed using the two precursors (Ni and Fe) individually, to establish growth rates of $Fe_2O_3$ and $NiO_x$ as a function of growth temperature on both $SiO_2/Si$ and on MgO. Thicknesses were determined by cross-sectional field emission scanning electron microscopy (FESEM). Growth rates depend on a number of factors, including the kinetics of precursor decomposition and on the reaction rates, as well as on the sticking coefficients of the various species. The growth rates for $Fe_2O_3$ on MgO and $Si/SiO_2$ are shown in FIG. 9.

The effect of precursor flow rate on the growth rate was also investigated. The normal liquid precursor flow rate was 0.15 ml/min. At a substrate temperature of 700° C., an additional experiment at a higher flow rate (0.3 ml/min) deposition was done in order to confirm that growth occurred in the mass-transport-limited regime. An approximate doubling of the growth rate for the high flow conditions confirms mass-transport limited growth. This result is important in that it establishes the existence of a pathway to higher growth rates.

Figure 10:
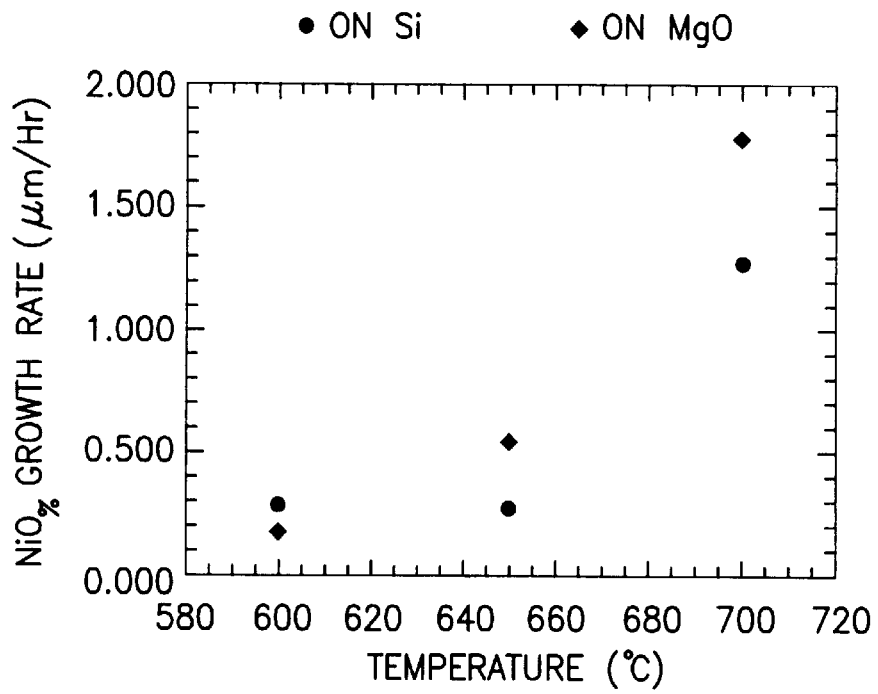
FIG. 10 illustrates growth rates for $NiO_x$ on Si and MgO, as a function of substrate temperature, representing embodiments of the present invention.

Referring now to FIG. 10, a second set of runs was performed for the Ni precursor. For both sets of runs, a vaporization temperature of 220° C. was used based on the DSC/TGA studies performed earlier in the program.

Figure 11:
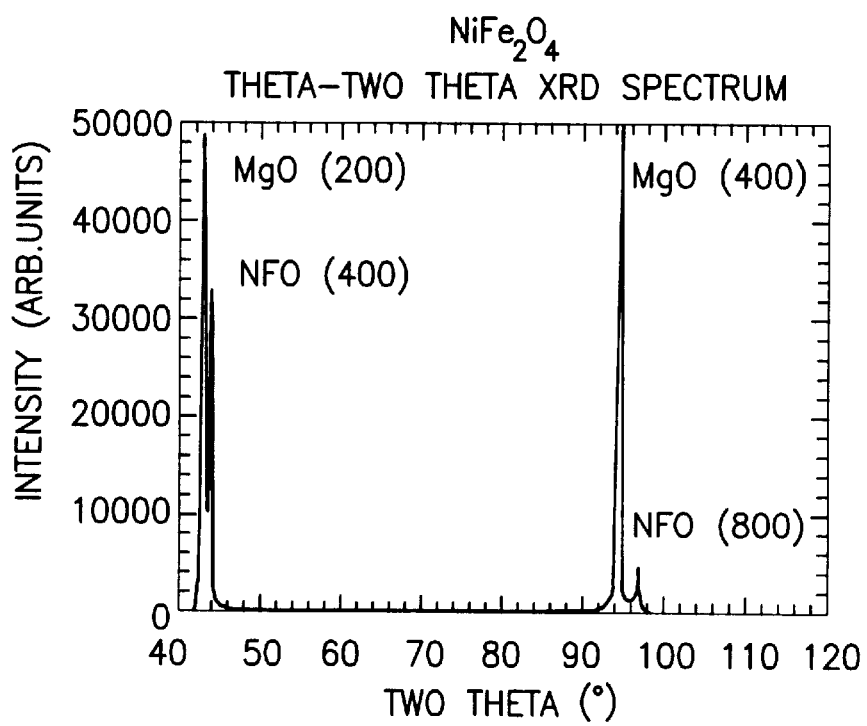
FIG. 11 illustrates an X-ray diffraction spectrum obtained from a sample of $NiFe_2O_4$ film grown on MgO at 650° C., representing an embodiment of the present invention.

These results were utilized to grow a $NiFe_2O_4$ film at 650° C. on MgO, using a solution flow rate of 0.15 ml/min. Precursor ratios of 34:66 (Ni:Fe) were chosen based on incorporation efficiencies calculated for $Fe_2O_3$ and NiOx. The growth rate for the ferrite film under this particular condition is 0.4 $\mu\beta$m/hr. The x-ray diffraction pattern for this sample is shown in FIG. 11, confirming that the proper phase was deposited. The rocking curve width for the film was less than the resolution of our instrument, demonstrating that a high quality match with the substrate was achieved.

Referring now to FIG. 11, an X-ray diffraction spectrum for a $NiFe_2O_4$ film grown on MgO at 650° C. is depicted. The film is highly oriented with respect to the substrate.

Additional films of $NiFe_2O_4$ were successfully deposited on MgO (100) substrates at various growth temperatures in the range of 600–650° C. and at different rates. High, mass-flow limited, growth rates of 0.6–1.2 μm/hr were achieved at a growth temperature of 650° C., using low-volatility precursors which allow for safe handling. The fact that the growth rate is mass-flow limited is an important result and it suggests that growth rates could be increased further by increasing the precursor flow rate into the reactor; this would not be the case if the growth rate were kinetically limited by surface reactions.

Figure 12:
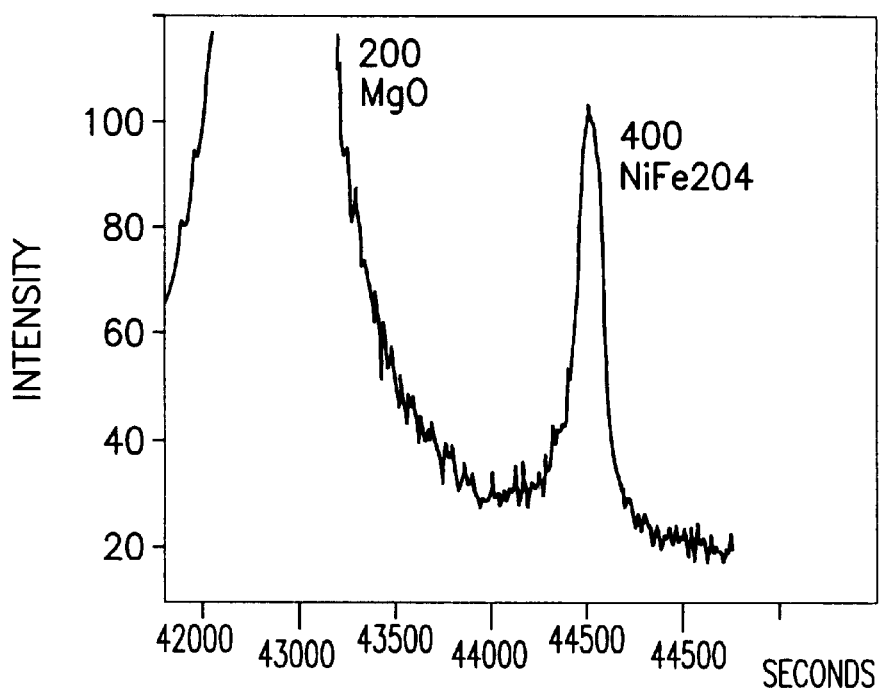
FIG. 12 illustrates an X-ray rocking curve obtained from a sample of $NiFe_2O_4$ deposited by MOCVD onto MgO at 650° C., representing an embodiment of the present invention.

The MgO substrates have a lattice mismatch of approximately 1% with the $NiFe_2O_4$, resulting in highly textured ferrite thin film. Very little lattice strain was observed relative to the bulk ferrite, for a 200 nm-thick film. FIG. 12 shows an X-ray rocking curve for $NiFe_2O_4$ deposited by MOCVD onto MgO at 650° C. is depicted. The full width half maximum valve is 0.046°, indicating exceptional crystalline quality in this epitaxial film. This demonstrates that $NiFe_2O_4$ films deposited by liquid delivery MOCVD are a vary high crystalline quality.

EXAMPLE II

Surface Characterization

Surface quality was also investigated, both by atomic force microscopy (AFM) and by field emission scanning electron microscopy (FESEM). In the best case, film surface roughness is less than 4.5 nm rms measured over a 1 mm area, with grain sizes ranging from 50 nm to 200 nm. Peak roughness were about 20–25 nm, commensurate with the surface roughness of our MgO substrates (smoother MgO can be obtained readily.) Substrates prepared for optimum surface smoothness before growth will very likely produce even smoother films than those reported here. Plan-view FESEM examination of two samples grown at different deposition rates (1.2 μm/hr—FIG. 18) and (0.6 μm/hr—FIG. 19) likewise showed very smooth surfaces, with lower growth rates resulting in somewhat smoother surfaces.

EXAMPLE III

Magnetic Characterization

Saturation magnetizations ($M_s$) of selected films were measured using a vibrating sample magnetometer (VSM). Room temperature magnetization loops from VSM indicated saturation magnetization occurring at from 5 kOe to 10 kOe applied field. The magnetization was about 110 emu/$cm^3$ for parallel fields, and 90 emu/$cm^3$ for perpendicular fields. The coercive fields varied by at least a factor of two for the two geometries, further indicating some degree of anisotropy. Films grown at the higher growth rate showed magnetization values of at least 130 emu/$cm^3$ for parallel fields, for a microstructure with larger, more isolated grains than that found in the lower growth rate samples. A slope in the hysteresis loop was observed on both the Fe—Ni bulk calibration standard and on the thin film MOCVD samples. Representative magnetization loops are included here as FIGS. 13, 14 and 15.

Figure 13:
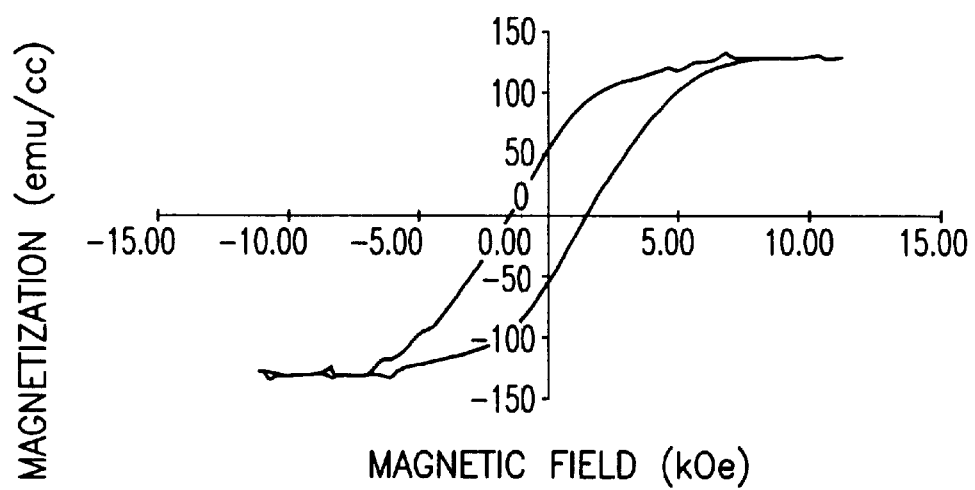
FIG. 13 illustrates a VSM magnetization loop in the parallel orientation measured from a $NiFe_2O_4$ film deposited on MgO by MOCVD at 650° C. with a growth rate of 1.2 mm/hr, representing an embodiment of the present invention.

FIG. 13 shows a VSM magnetization loop in the parallel orientation for a NiFe2O4 film deposited on MgO by MOCVD at 650° C. with a growth rate of 1.2 mm/hr is depicted. The slope observed in FIG. 17 and others was also observed in the calibration standard for the instrument and is believed to be an artifact.

Figure 14:
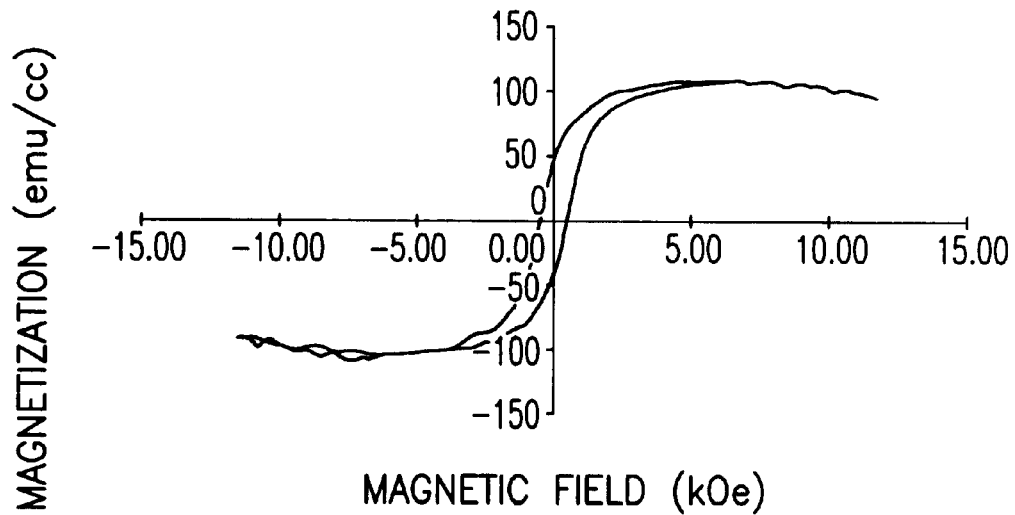
FIG. 14 illustrates a VSM magnetization loop in the parallel orientation measured from a $NiFe_2O_4$ film deposited on MgO by MOCVD at 650° C. with a growth rate of 0.6 mm/hr, representing an embodiment of the present invention.

FIG. 14 shows a VSM magnetization loop in the parallel orientation for a $NiFe_2O_4$ film deposited on MgO by MOCVD at 650° C. with a growth rate of 0.6 mm/hr is depicted.

Figure 15:
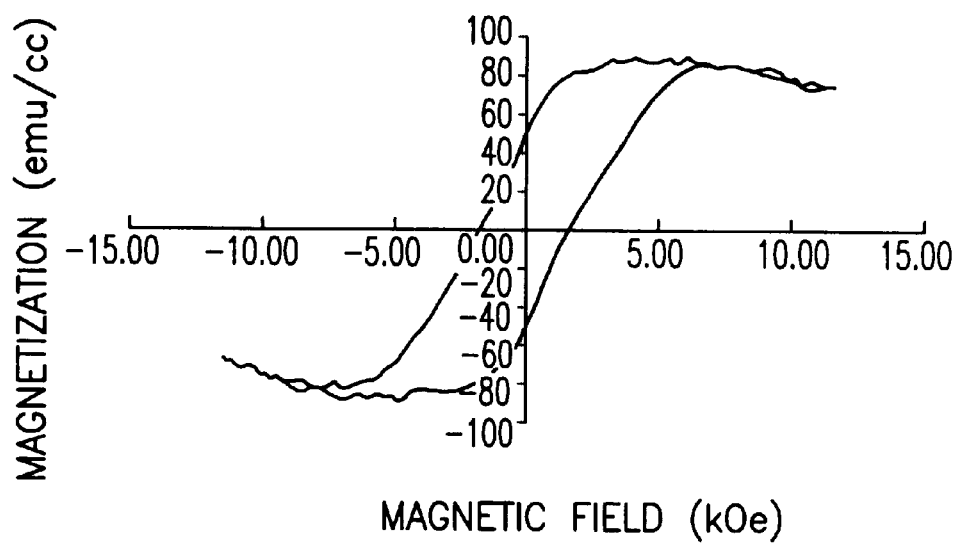
FIG. 15 illustrates a VSM magnetization loop in the perpendicular orientation measured from a $NiFe_2O_4$ film deposited on MgO by MOCVD at 650° C. with a growth rate of 0.6 mm/hr, representing an embodiment of the present invention.

FIG. 15 shows a VSM magnetization loop in the perpendicular orientation for a NiFe2O4 film deposited on MgO by MOCVD at 650° C. with a growth rate of 0.6 mm/hr is depicted. Approximately 2× anisotropy in the coercive field was observed in this sample (c.f. FIG. 2.)

The magnetic properties are dependent on film stoichiometry and microstructure. There film qualities can be optimized within the practice of the present invention, without undue experimentation, by adjustment of substrate growth temperature, flow rates, reactor pressure, selection and ratios of oxidant—$O_2$, $N_2O$, $O_3$, variations in surface preparation, and use of buffer or lattice-matching interlayers.

EXAMPLE IV

Electrical Characterization

Electrical resistivity of the films was measured using a two point probe. Values of greater than $10^6$ ohm-cm were observed, which was the maximum value attainable on the tester. This value is consistent with high quality, highly resistive films.

A primary practical application of the present invention is the fabrication of thin film ferrite devices. Further, the present invention is useful in conjunction with ferrite devices such as are used for the purpose of discrete filters, limiters, phase shifters, isolators or circulators, or the like.

All the disclosed embodiments of the invention described herein can be realized and practiced without undue experimentation. Although the best mode contemplated by the inventors of carrying out the present invention is disclosed above, practice of the present invention is not limited thereto. It will be appreciated that various additions, modifications and rearrangements of the features of the present invention may be made without deviating from the spirit and scope of the underlying inventive concept. Accordingly, it will be appreciated by those skilled in the art that, within the scope of the appended claims, the invention may be practiced otherwise than as specifically described herein.

For example, the invention could be enhanced by providing additional ingredients in the precursor chemistry. Similarly, although the preferred precursor chemistry is described, any suitable materials could be used in its place. In addition, the ferrite layers need not be fabricated with the disclosed method, but could be fabricated using other suitable procedures. Further, although the ferrite layers are described herein as physically separate structures, it will be apparent that the ferrite layers may be integrated into the apparatus with which they are associated, and that multiple layer structures and devices comprising such ferrite layers are contemplated as being usefully employed in the broad practice of the present invention.

What is claimed is:

1. A method of forming an epitaxial thin film ferrite material on a substrate from corresponding precursor(s), comprising liquid delivery of the precursor(s) in anhydrous organic solvent solution and flash vaporization of the solution at a temperature of between 100° C. and 300° C. to yield a precursor vapor, and transporting the precursor vapor to a chemical vapor deposition reactor for chemical vapor deposition formation of the epitaxial thin film ferrite material on the substrate.

2. A method according to claim 1, wherein the precursor(s) comprise organometallic compounds or coordinated complexes of metal(s) selected from the group consisting of barium, nickel, zinc, iron, manganese, and cobalt.

3. A method according to claim 1, wherein the precursor(s) include metal β-diketonate compounds or coordinated complexes.

4. A method according to claim 1, wherein the precursors (s) include metal fluorinated β-diketonate compounds or coordinated complexes.

5. A method according to claim 1, wherein the precursor (s) include metal β-diketonate Lewis base adducts.

6. A method according to claim 1, wherein the ferrite material is selected from the group consisting of Ni—Zn ferrite, Ni—Mn ferrite, and Ba hexaferrite.

7. A method according to claim 1, wherein the precursor vapor is transported to the chemical vapor deposition reactor in a carrier gas.

8. A method according to claim 7, wherein the carrier gas is selected from the group consisting of argon, nitrogen, neon, helium and ammonia.

9. A method according to claim 7, wherein the carrier gas is mixed with an oxidizing co-reactant gas prior to its transport to the chemical vapor deposition reactor.

10. A method according to claim 1, wherein the chemical vapor deposition reactor contains a substrate article heated to a temperature in the range of from 300° C. to 1200° C.

11. A method according to claim 10, wherein the pressure of the precursor vapor in the chemical vapor deposition reactor is from about 0.1 to about 760 torr.

12. A method according to claim 1, wherein the chemical vapor deposition is plasma-assisted.

13. A method according to claim 1, wherein the precursor (s) comprise a β-diketonate ligand selected from the group consisting of $Fe(thd)_3$, $Zn(thd)_2$ and $Ni(thd)_2$.

14. A method according to claim 1, wherein said precursor (s) comprise a Lewis base adduct of a metal β-diketonate compound, and the Lewis base adduct is selected from the group consisting of $Ni(thd)_2(teg)$, $Ni(thd)_2(tmeda)$, $Ni(thd)_2(hfac)_2$, $Ni(hfac)_2(tmeda)$, $Zn(hfac)_2(tmeda)$ and $Zn(hfac)_2(tmeda)$.

15. A method according to claim 1, wherein said precursor (s) comprise a metal β-diketonate compound selected from the group consisting of $Ni(hfac)_2$ and $Zn(hfac)_2$, and $Fe(hfac)_3$.

16. A device comprising a ferrite layer on a substrate, wherein said ferrite layer is formed on the substrate by a process including: providing corresponding precursor(s) for said ferrite layer, transporting said precursor(s) by liquid delivery of the precursor(s) in anhydrous organic solvent solution and flash vaporization of the solution at a temperature of between 100° C. and 300° C. to yield a precursor vapor, and transporting the precursor vapor to a chemical vapor deposition reactor for chemical vapor deposition formation of the thin film ferrite material on the substrate.

17. A composition forming a thin film ferrite material on a substrate, wherein the material is formed from precursor(s) including a metal β-diketonate Lewis base adduct of a metal β-diketonate selected from the group consisting of (i), (ii) and (iii):

(i) $Fe(thd)_3$, $Zn(thd)_2$ and $Ni(thd)_2$;

(ii) $Fe(thd)_3$, $Mn(thd)_2$ and $Ni(thd)_2$; and (iii) $Ba(thd)_3$ and $Fe(thd)_2$.

18. A composition according to claim 17, wherein the composition comprises an anhydrous, organic solvent for the precursor(s).

19. A composition according to claim 18, wherein the solvent for the precursor(s) is composed of tetrahydrofuran, isopropanol, and a Lewis base component.

* * * * *

UNITED STATES PATENT AND TRADEMARK OFFICE
CERTIFICATE OF CORRECTION

PATENT NO. : 6,030,454  Page 1 of 1
DATED : February 29, 2000
INVENTOR(S) : Jeffrey F. Roeder and Thomas H. Baum It is certified that error appears in the above-identified patent and that said Letters Patent is hereby corrected as shown below:

Column 2,
Line 29, change "a nd" to -- and --.

Column 5,
Line 30, change ($\geq 10^{-3}$ torr) to -- (• $10^{-3}$ torr) --.

Column 6,
Line 30, change "inveniton" to -- invention --.

Column 7,
Line 1, after "ferrite films", a new paragraph should start.

Column 9,
Line 39, change "≤2%" to -- • 2% --.

Column 10,
Line 60, change "µβm/hr." to -- $\mu$m/hr. --.

Column 11,
Lines 19-20, "are a vary" to -- has a very --.

Signed and Sealed this

Twenty-first Day of January, 2003

JAMES E. ROGAN
*Director of the United States Patent and Trademark Office*